US006931611B2

(12) United States Patent
Martin et al.

(10) Patent No.: US 6,931,611 B2
(45) Date of Patent: Aug. 16, 2005

(54) DESIGN VERIFICATION SYSTEM FOR AVOIDING FALSE FAILURES AND METHOD THEREFOR

(75) Inventors: Andrew K. Martin, Austin, TX (US); Narayanan Krishnamurthy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 291 days.

(21) Appl. No.: 10/025,289

(22) Filed: Dec. 19, 2001

(65) Prior Publication Data

US 2003/0115562 A1 Jun. 19, 2003

(51) Int. Cl.[7] .............................................. G06F 17/50
(52) U.S. Cl. ............................................. 716/5; 716/1
(58) Field of Search ..................... 716/1, 5, 4; 702/109, 702/117, 118

(56) References Cited

U.S. PATENT DOCUMENTS

| 5,754,454 | A | | 5/1998 | Pixley | |
| 6,035,107 | A | * | 3/2000 | Kuehlmann et al. | ........... 716/1 |
| 6,321,173 | B1 | * | 11/2001 | Foster | ........................ 702/109 |
| 6,378,112 | B1 | * | 4/2002 | Martin et al. | .................. 716/5 |

OTHER PUBLICATIONS

A. Hu, Formal hardware Verification with BDDs: An Introduction, IEEE Pacific Rim Conference on Communications, Computers and Signal Processing, pp. 677–682, Aug. 1997.*

R.E. Bryant et al., Formal Hardware Verification by Symbolic Ternary Trajectory Evaluation, 28th ACM/IEEE Design Automatio Conference, pp. 397–402, Jun. 1991.*

W.S. Lee et al., Automatic Verification of Refinement, IEEE International Conference on Computer Design: VLSI in Comput rs and Processors, pp. 226–229, Oct. 1994.*

Narayanan Krishnamurthy et al., "Design and Development Paradigm for Industrial Formal Verification CAD Tools", IEEE Design & Test of Computers, Jul.–Aug. 2001, pp. 26–35.

J.R. Burch et al., "Representing Circuits More Efficiently in Symbolic Model Checking", 1991 28th ACM/IEEE Design Automation Conference, Paper 24.3, pp. 403–407.

* cited by examiner

Primary Examiner—A. M. Thompson
(74) Attorney, Agent, or Firm—Joanna G Chiu; Robert I. King (57) ABSTRACT

Embodiments of the present invention provide for a method and system for verifying that an implementation design is functionally equivalent to a predetermined functionality of a reference design where the reference and implementation designs may correspond to a portion of a larger integrated circuit design. The use of Symbolic Trajectory Evaluation (STE) to compare the designs may result in false failures. Therefore, one aspect of the present invention provides for comparing an expected result from the reference design to an actual result of the implementation design in order to determine a set of failure conditions. Constraints are then selectively applied to the set of failure conditions in an attempt to remove them. Another aspect of the present invention allows for the selective use of symbols rather than "X"s (unknowns) in order to avoid false failures due to certain inputs of the implementation design not being properly stimulated.

26 Claims, 5 Drawing Sheets

DESIGN VERIFICATION SYSTEM FOR AVOIDING FALSE FAILURES AND METHOD THEREFOR

FIELD OF THE INVENTION

This invention relates generally to verification and equivalence checking for design blocks, such as design blocks for semiconductor devices, including microprocessors and related elements.

BACKGROUND OF THE INVENTION

For designs of semiconductor devices, such as microprocessors, conventional methods of performing design simulation and verification are to model the design with a high level view, such as an RTL (Register Transfer Level) description and a separate low level view, such as a transistor schematic or net list. The high level view has the advantage of fast simulation and functional verification. However, simulation of the high level model does not guarantee correctness of a physical semiconductor device made in accordance with the corresponding transistor schematic. To provide improved quality testing, the transistor schematic view has been simulated. However, due to the very large number of transistor elements in commercial designs, full chip simulation is not economically practical. Even simulation of transistor schematic designs for a portion of the chip, full error detection coverage using conventional simulation is not available.

Another approach for verification of designs for certain classes of circuits, typically static combinational circuits, is known as formal equivalence checking. This approach uses mathematical models of stable outputs of networks of combinational logic. While this approach is useful for certain types of circuits, the technique is generally not applicable for circuits that have self-timing elements, such as memory arrays. Since memory arrays are often a significant portion of a design for a semiconductor device, it would be desirable to perform formal equivalence checking on memory arrays. The conventional methods do not address transient outputs within clock phases that are necessary for self timed circuits.

Accordingly, there is a need for an improved method and system to verify design blocks with multiple views.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE DRAWINGS

Figure 1:
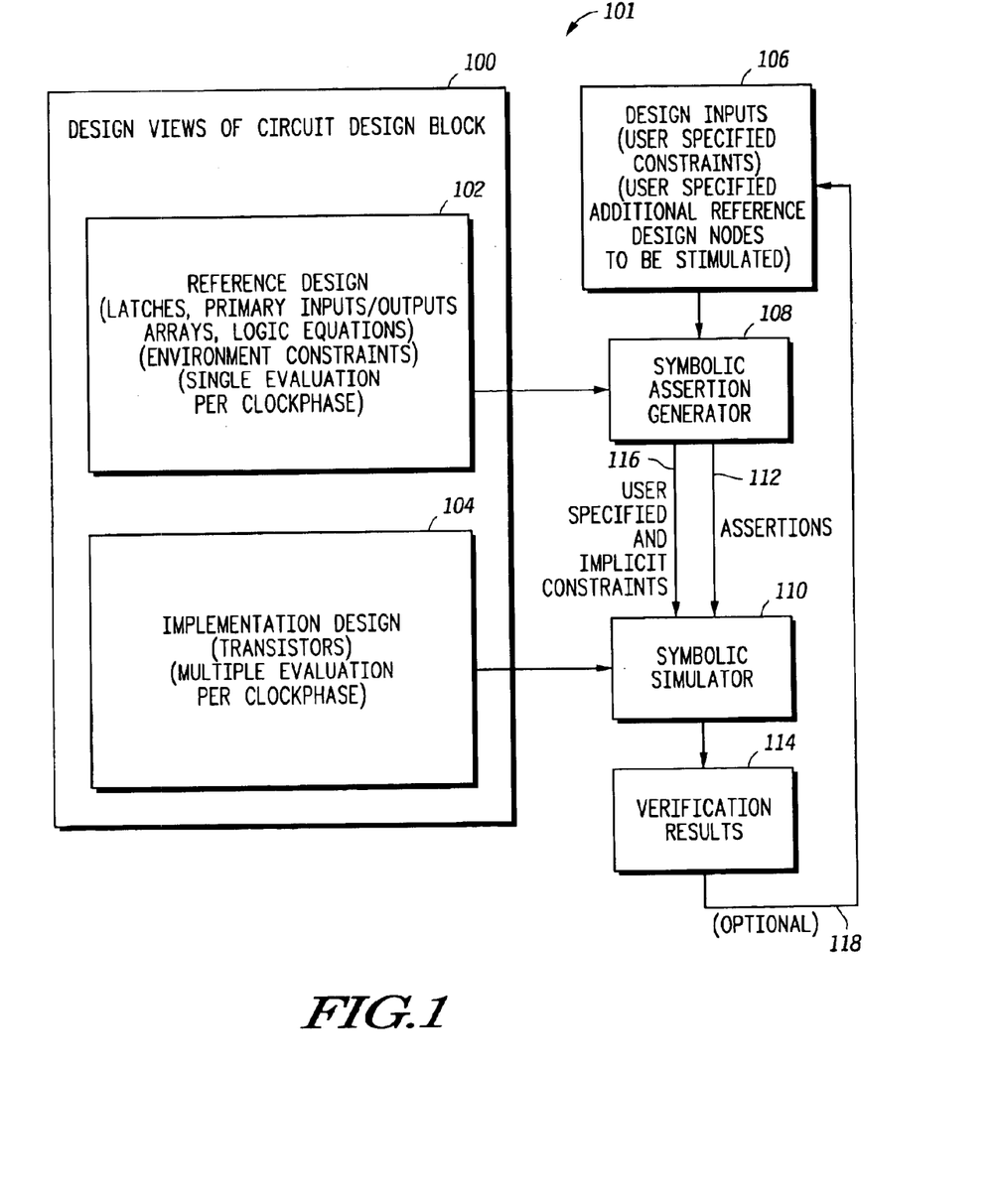
FIG. 1 illustrates one embodiment of a verification system for comparing different views of a design block.

A verification system, such as that illustrated in FIG. 1, may use Symbolic Trajectory Evaluation (STE) to compare one design representation such as a reference model, with another representation of the same design (or of a different design) such as an implementation model. A verification system may use the introduction of free variables representing the value of intermediate comparison points at various times. The introduction of such variables can cause false failures if the values that they represent are not independent in the implementation model. That is, they may be dependent as designed and represented in the implementation model, but independent in the reference model. Therefore, it is desirable to use constraints capturing these dependencies in the implementation model between such variables to avoid reporting false failures.

Unlike other simulation methods where each node of a design under analysis has a well defined value at all times, STE allows for increased coverage when some values are allowed to be "unknown" or "X" rather than a 0 (logic low) or a 1 (logic high). This allows many cases to be simulated simultaneously by allowing certain signals to take on the value "X" or unknown at times during which their value is not relevant to the simulation result. Simulation using "X" is considered conservative. For example, if the property that is being established holds true for "X", it also holds true for either 0 or 1. However, some properties will fail with "X" even though exhaustive analysis with "0" and "1" instead of "X" would establish the property to be true. Thus the use of "X" in STE may result in false failures.

STE, though, allows the use of symbols in addition to "0", "1", and "X". In cases for which an "X" is too conservative, a unique symbol can be used in its place. This unique symbol can represent a 1 or 0 value, but not an "X" (unknown) value. Thus, a unique symbol assures that an actual value, rather than an "X", is used for analysis. However, symbols should be used selectively because if all possible inputs are driven with independent unique symbols, the resulting symbolic simulation would become prohibitively complex and may fail to complete. Thus, it is desirable to selectively decide which inputs should be symbols, and which should be "X".

FIG. 1 illustrates one embodiment of a verification system 101 for comparing different views of a circuit design block. Design views 100 include a first view and a second view of a circuit design block. The circuit design block may be any circuit design such as, for example, a custom circuit block found within a microprocessor. Furthermore, the circuit design block may be the entire microprocessor, the entire custom circuit block, or only a portion thereof. That is, a large circuit design is generally partitioned into smaller circuit blocks representing smaller portions of the larger design. Therefore, in one embodiment, each of the first view and the second view represent different representations of a same circuit design block where the two views need to be compared. Alternatively, each of the first view and second view may correspond to different circuit design blocks whose equivalence needs to be verified. The first view may be referred to as a reference design 102 (or as a reference representation). This reference design, for example, may be an RTL representation that includes data representing latches, such as transparent latches, primary inputs, primary outputs, memory arrays, and digital logic equations, as well as optionally environmental constraints. Alternatively, reference design 102 may be a gate level representation of a particular design. If reference design 102 is an RTL representation, reference design 102 allows for simulation with a single evaluation for each phase of a main clock, such as cycle based simulation. The main clock may be a clock signal that drives execution of instructions by a microprocessor.

The second view may be referred to as an implementation design 104 (or an implementation reference). Implementation design 104 may be, for example a schematic representation which includes data that represents a large number of interconnected transistor elements, also referred to as a transistor representation. Alternatively, the implementation design 104 could be a higher level view of a design, such as a gate level representation. In one embodiment, reference design 102 and implementation design 104 may be the same type of representation (such as both RTL or gate level representations), or alternatively, one design may represent a higher level view of the circuit design. For ease of explanation, the examples given herein correspond to reference design 102 being an RTL representation and implementation design 104 being a schematic representation where the schematic representation can be considered one implementation of the higher level RTL representation. However, it should be understood that this is only one example, and the descriptions herein apply to any kind of representations used for either the reference or implementation design.

The data representing either the reference design 102 or the implementation design 104 may be in the form of a netlist or any form of data stored in a computer database. In a particular embodiment of implementation design 104, an event-based simulator may evoke multiple evaluations for each phase of the main clock. For example, in a particular simulation application, there may be a range of from two to hundreds of evaluations for a particular main clock phase. Multiple evaluations are particularly useful in simulating self-timed circuits, such as static memories.

Reference design 102 is input to a symbolic assertion generator 108. Note that symbolic assertion generator 108 may receive a reference design corresponding to an entire circuit design or circuit design block, or only portions thereof, depending on the requirements of verification system 101. Symbolic assertion generator 108 also receives design inputs 106. Design inputs 106 include clock phase-based timing types for primary inputs, latches, primary outputs, and bit cells of memory arrays. (Alternatively, design inputs 106 may include only a portion of all inputs and the rest of the inputs may be computed by symbolic assertion generator 108.) Phase-based timing type is used to indicate for a particular circuit element, logic states (e.g. logic high, low, new or previous data value) for each phase of the main clock. For example, a phase-based timing type of a clock signal could be represented by a high logic state for phase 1 of the main clock and a low logic state for phase 2 of the main clock where the main clock has only two phases. Another type could be defined to have a new data during phase 1 and retain a previous data value during phase 2 of the main clock. It will be appreciated that many additional types may be defined based on particular circuits being simulated or on various design applications. Design inputs 106 further includes mapping information that relates timing and location of circuit elements from reference design 102 and implementation design 104. Design inputs 106 may also include user specified constraints (to be described further below) for use by symbolic assertion generator 108 and symbolic simulator 110. Design inputs 106 may also include additional reference design nodes which may either be user specified or tester generated (i.e. generated by symbolic assertion generator 108 or symbolic simulator 110).

Symbolic assertion generator 108 produces assertions 112 from reference design 102 and design inputs 106. The symbolic assertions consist of one or more antecedents describing symbolic stimulus to be applied to the circuit and one or more consequents describing expected results. Each antecedent and consequent includes a time interval, the name of a circuit node from implementation design 104, a symbolic guard, and a symbolic value or function. The symbolic guards, values or functions may be Boolean constants, or Boolean functions, such as binary decision diagrams (BDD). Assertions 112 are used to provide stimulus and expected results for symbolic simulation. Assertions 112 are fed into symbolic simulator 110 that also receives data for implementation design 104. Symbolic simulator 110 may receive an implementation design corresponding to an entire circuit design or circuit design block, or only portions thereof, depending on the requirements of verification system 101. Symbolic simulator 110 also receives constraints 116. These constraints may include implicit constraints (those generated by symbolic assertion generator 108) or user specified constraints (e.g. those that are explicitly stated by a user of verification system 101 and provided as part of design inputs 106).

An example of a symbolic simulator is described in "Voss—A Formal Hardware Verification System: User's Guide", Carl-Johan H. Seger, Technical Report 93–45, Dept. of Computer Science, University of British Columbia, 1993. Symbolic simulator 110 executes a computer simulation on the implementation design 104 of design block 100 with the antecedents of assertions 112 providing stimulants and the consequents of assertions 112 providing expected results. The symbolic simulation may include use of scalar values as a substitute for a set or subset of symbols. The output of such a simulation is a set of difference symbolic functions, such as BDDs, that thereby produce verification results 114. The difference symbolic functions characterize the difference between the expected values and the data values produced during the simulation. Where the symbolic functions indicate no difference, reference design 102 and implementation design 104 are functionally equivalent. Thus, the assertions are used to check functional equivalence between reference design 102 and implementation design 104. Optionally, (via option 118 after obtaining verification results 114) design inputs 106, reference design 102, or implementation design 104 may be modified and verification system 101 may be run again using the modified inputs.

Symbolic assertion generator 108 may be implemented as a computer program that executes on a computer, such as a personal computer or engineering work station. Similarly, symbolic simulator 110 may be implemented as a computer program that executes on a computer, and can be within the same computer program as symbolic assertion generator 108 or within a separate program. The database containing the design views of design block 100 may be located in the same computer as either symbolic assertion generator 108 or symbolic simulator 110, or may be an external database, external to the computer executing symbolic assertion generator 108 and symbolic simulator 110. Therefore, in one embodiment, symbolic assertion generator 108 and symbolic simulator 110 may be referred to as a tester for the design views 100 receiving reference design 102, implementation design 104, design inputs 106, and providing verification results 114. Alternatively, other testers may be used to compare reference design 102 with implementation design 104.

Verification system 101 operates to compare a functionality of implementation design 104 with a predetermined functionality of reference design 102. That is, it is not necessary for reference design 102 and implementation design 104 to be fully functionally equivalent. As discussed above, though, implementation design 104 may introduce variable dependencies that are not apparent in reference design 102, thus leading to the detection of false failures. Verification system 101 therefore provides for avoiding false failures, as will be discussed below.

Figure 2:
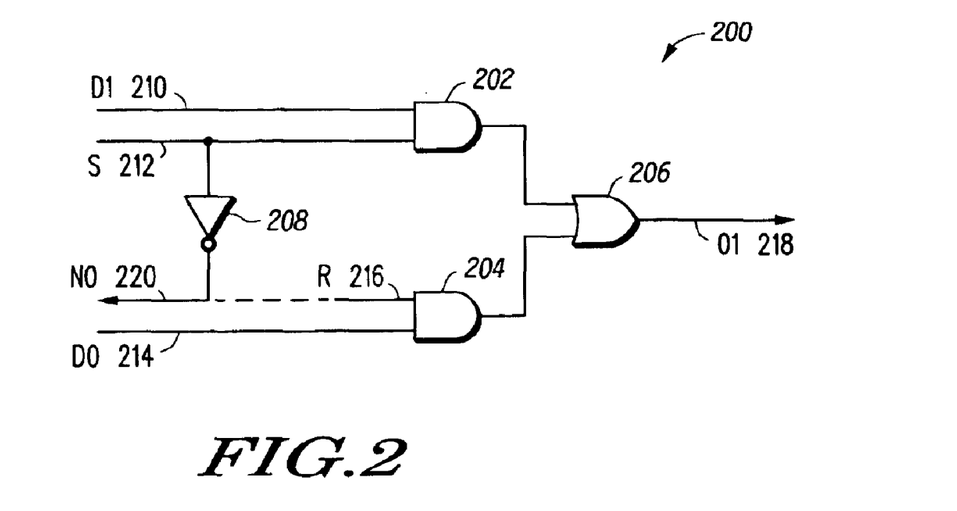
FIGS. 2 and 3 are circuit representations illustrating exemplary designs for a portion of a circuit.

FIG. 2 illustrates a reference design 200 corresponding to a circuit design block which is one example of reference design 102 of FIG. 1. The circuit block may be a part of a larger circuit block or circuit design such as a custom logic block or microprocessor. Reference design 200 may be an RTL representation that models a two input (D1 210, D0 214) multiplexer (MUX) as two AND gates (202 and 204) coupled to an OR gate 206 to provide an output O1 218 based on a select signal input S 212. Reference design 200 includes AND gate 202 coupled to receive D1 210 and S 212, AND gate 204 coupled to receive R 216 and D0 214. The outputs of AND gates 202 and 204 are coupled to the inputs of OR gate 206, which provides output O1 218. Note that R 216 is introduced as a cutpoint in reference design 200, as illustrated by the dotted lines between R 216 and the output of inverter 208. Prior to the cut, S 212 was coupled to the input of AND gate 204 via inverter 208. After the cutpoint is made, though, the output of inverter 208 is provided as a new output NO 220 of reference design 200, and a new checkpoint is introduced as R 216. Checkpoints generally refer to the inputs, outputs, and state holding elements of a block design. Checkpoints can include primary inputs, inputs resulting from cutpoints, primary outputs, outputs resulting from cutpoints, and state holding elements (where state holding elements may refer to latches, bitcells, registers, bus keepers, flip flops, or any other storage devices.) Reference design 200 includes a variety of check points: D1 210, S 212, R 216, and D0 214 which all feed into output node O1 218. Therefore, it can be understood how the values of these checkpoints affect O1 218.

With the introduction of a cutpoint R216 and the resulting checkpoint NO 220, a constraint of the circuit design can be obtained. Constraints represent restrictions on permissible test parameters. For example, since a cutpoint was introduced at the output of inverter 208, a constraint of "R=NOT S" is obtained, meaning that R cannot be equal to S. Since R was coupled to the output of inverter 208, R is simply the inverse of S which results in R never being able to equal S. Therefore, permissible test parameters for R and S are restricted, because R, S can never have the combination 0,0 or 1,1. Note that constraints may also arise from a variety of other situations other than by the creation of cutpoints in a design (either the reference or implementation design). For example, constraints can also be generated by input signals external to a design (i.e. from primary inputs) or from state holding elements within a design. Also, the design or user of the verification system may restrict certain primary inputs or values that can occur within a state holding element.

Figure 3:
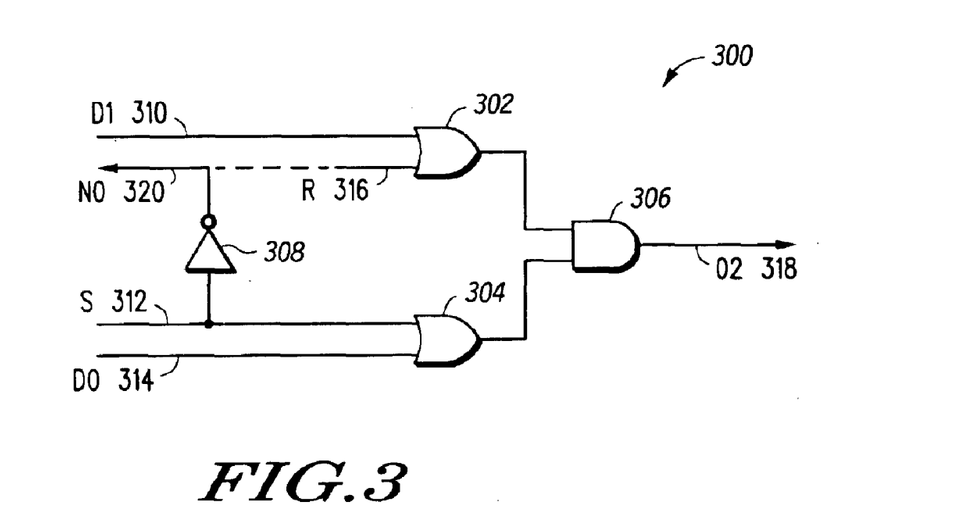

FIG. 3 illustrates implementation design 300 corresponding to the same circuit block as reference design 200 where implementation design 300 is one example of implementation design 104. Note that implementation design 300 is a different view of the circuit block as compared to reference design 200. In one embodiment, reference design 200 may correspond to an RTL representation while implementation design 300 may correspond to a transistor or gate level design. Implementation design 300 is also supposed to provide the functionality of a two input MUX. However, it is only one of many possible designs to implement this functionality. Implementation design 300 includes an OR gate 302 coupled to receive D1 310 and R 316, an OR gate 304 coupled to receive S 312 and D0 314, and an AND gate 306 coupled to OR gates 302 and 304 and coupled to provide output O2 318. Implementation design 300 includes a checkpoint R 316 at a cutpoint, as illustrated by the dotted lines. Prior to the cutpoint, S 312 was coupled as an input to OR gate 302 via inverter 308, but with the cutpoint, inverter 308 provides a new output NO 320.

Figure 4:
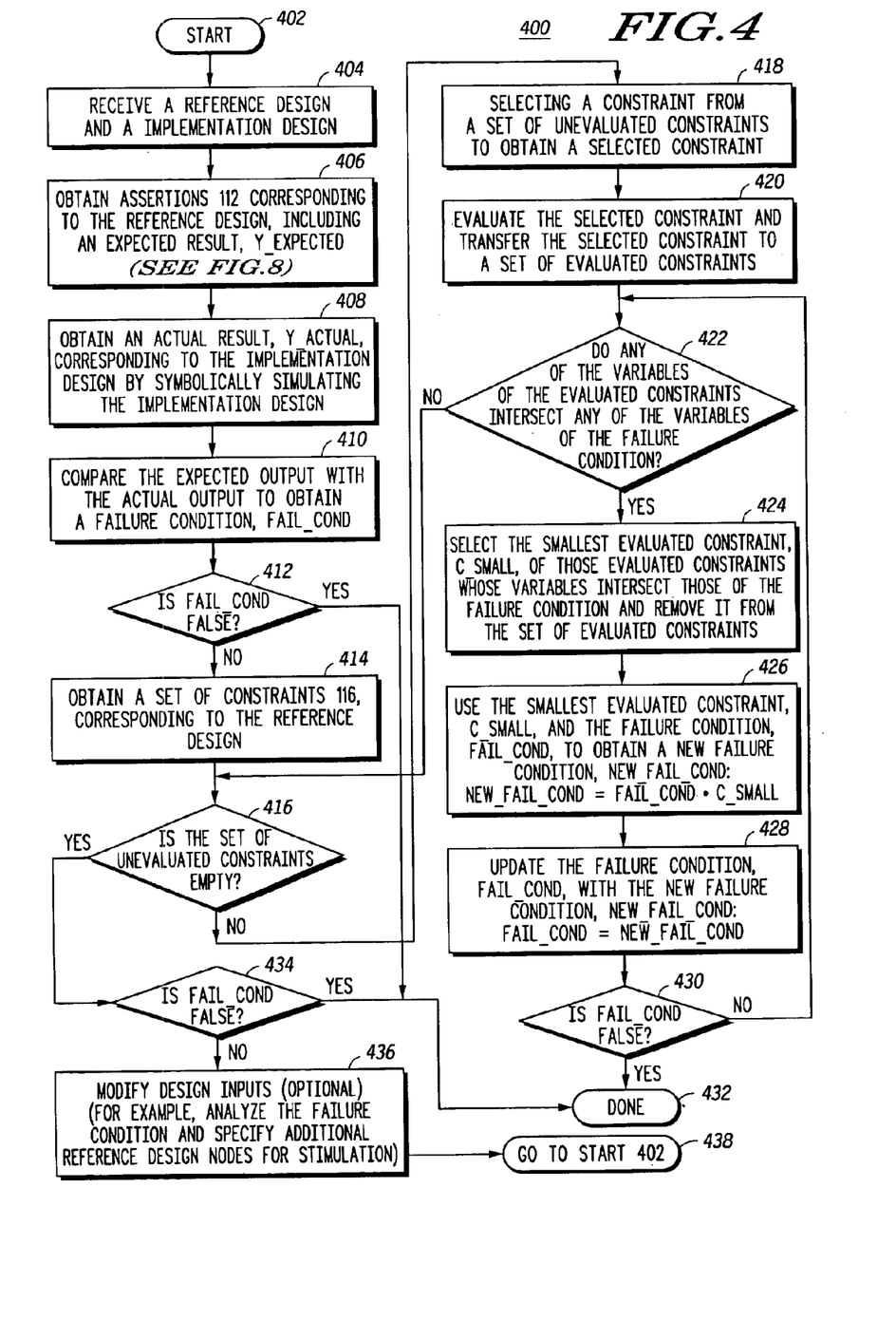
FIG. 4 is a flow diagram that illustrates a method of comparing different views of a circuit design, according to one embodiment of the present invention.

FIG. 4 illustrates a method of comparing different views of a circuit design, according to one embodiment of the present invention. In describing flow 400 of FIG. 4, FIGS. 2 and 3 will be used as an example case; however, flow 400 can be used for any two design views. Flow begins at START 402 and proceeds to block 404 where a reference design and an implementation design are received, such as, for example, reference design 200 and implementation design 300. (The process of block 404 may be performed by symbolic assertion generator 108 and symbolic simulator 110 of FIG. 1.) In block 406, assertions 112 are obtained corresponding to reference design 200, including an expected result, Y_expected. Therefore, the expected result for reference design 200 at checkpoint output O1 is as shown in Equation 1.

$$Y\_expected = R \cdot D0 + S \cdot D1 \qquad \text{Eq. 1}$$

Note that a "+" indicates a logic OR operation and a "·" indicates a logic AND operation. (Also note that the obtaining of assertions in block 406 will be described in more detail in reference to FIG. 7 below.) Flow then proceeds to block 408 where an actual result, Y_actual, corresponding to the implementation design is obtained by symbolically simulating the implementation design (such as by symbolic simulator 110). The actual result corresponding to implementation design 300 is as shown below in Equation 2.

$$Y\_actual = (R + D1)(S + D0) \qquad \text{Eq. 2}$$

Therefore, one design view, such as reference design 200, may be an RTL representation where the expected functionality results in Y_expected. However, when actually implemented, such as in a transistor level implementation, the actual functionality is Y_actual. Therefore, the expected functionality and the actual functionality must be compared to obtain a failure condition, Fail_cond (block 410), also referred to as a characterization of the failure. (Alternatively, a set of failure conditions may be obtained, depending on the reference and implementation designs being verified.) The failure condition can be generally expressed as shown in Equation 3.

$$Fail\_cond = Y\_expected \ XOR \ Y\_actual \qquad \text{Eq. 3}$$

That is, Fail_cond will only be satisfied for valuations of the symbols in which Y_expected and Y_actual are not logically equivalent, because an XOR (exclusive OR) operation only produces a 1 (indicating a logically true state) if Y_expected and Y_actual are different. If Fail_cond is false (indicated by a 0 in this example) for all possible valuations of the symbols within Y_expected and Y_actual, then the implementation design is functionally equivalent to the functionality of the reference design that results in Y_expected. Applying Equations 1 and 2 to Equation 3 for the reference design 200 and implementation design 300, the following failure condition (Equation 4) is obtained.

$$\text{Fail\_cond}=R \cdot S \cdot D1' \cdot D0' + R' \cdot S' \cdot D1 \cdot D0 \qquad \text{Eq. 4}$$

Note that an "'" (apostrophe) following a variable indicates the logical inverse of the variable, e.g. D1'=NOT D1. Flow proceeds to decision diamond 412 where it is determined whether Fail_cond is false. If Fail_cond is false for all possible valuations of the symbols, flow proceeds to DONE 432 because there are no more failure conditions. In this case, Y_expected and Y_actual are functionally equivalent and analysis of the current design is complete. However, using the example of Equation 4, Fail_cond is not false, thus flow proceeds to block 414 where a set of constraints corresponding to the reference design is obtained. As discussed above, there are many ways to obtain constraints from a circuit block. A single reference design may have any number of constraints which may be user specified or tester generated. For example, a tester (such as symbolic assertion generator 108, for example), has knowledge of the circuitry preceding a cutpoint, and thus can obtain the constraint corresponding to each cutpoint. For example, in reference design 200, the constraint is given as follows in Equation 5.

$$C1=R' \cdot S + S' \cdot R \qquad \text{Eq. 5}$$

The tester can generate this constraint knowing that the circuitry at the cutpoint provides R=S'. Alternatively, a user can provide additional constraints. Therefore, the resulting set of constraints 116 is provided to symbolic simulator 110 and flow proceeds to decision diamond 416 where it is determined whether the set is empty or not. If so, flow proceeds to decision diamond 434 where it is determined if Fail_cond is false. If Fail_cond is false, the comparison is complete and the process ends at DONE 432. However, if the set of constraints is not empty (at decision diamond 416), then the constraints can be selectively applied to the failure condition, Fail_cond, to try to remove the failure condition (by making it false). Therefore, flow proceeds to block 418 where a constraint is selected from a set of unevaluated constraints to obtain a selected constraint. Note that initially, all constraints obtained in block 414 are unevaluated, therefore, the set of unevaluated constraints is initially the same as the set of constraints. Also, in block 418, any constraint may be selected as the selected constraint. For example, a constraint may be arbitrarily chosen from the set of unevaluated constraints, or an algorithm may be used to selectively determine which constraint to proceed with.

Once a constraint is selected, flow proceeds to block 420 where the selected constraint is evaluated. For example, the constraint may be represented as a code block that needs to be evaluated to produce a Boolean expression. After evaluating the selected constraint, it is transferred from the set of unevaluated constraints to a set of evaluated constraints. That is, once a constraint is evaluated, it is marked as such, and therefore, does not have to be reevaluated at a later time during the analysis of the current reference design. (In the current embodiment, the evaluated constraint is marked by simply being transferred to a set of evaluated constraints, but alternatively, other methods may be used to mark a constraint as evaluated, such as, for example, through the use of flags or control bits.) Flow proceeds to decision diamond 422 where it is determined if any of the variables of the evaluated constraints intersect any of the variables of the failure condition. For example, since there is only one constraint in the set of unevaluated constraints for reference design 200, constraint C1 (Equation 5) becomes the selected constraint and is evaluated and then transferred to the set of evaluated constraints. The variables of C1 include R and S and the variables of Fail_cond include R, S, D1, and D0, meaning they intersect (e.g. R and S are in common). Therefore, if the variables of any one of the failure conditions intersect the variables of any one of the evaluated constraints, as with Equations 4 and 5, flow proceeds to block 424.

In block 424, the smallest evaluated constraint, C_small, of those evaluated constraints whose variables do intersect those of the failure condition is selected and removed from the set of evaluated constraints. Therefore, in decision diamond 422, there may be more than one evaluated constraint within the set of evaluated constraints whose variables intersect at least one variable of the failure condition. In this case, the smallest of those evaluated constraints is selected as C_small for combination with the failure condition (as will be described in reference to block 426). An evaluated constraint that results in the least complex combination with the failure condition is considered the "smallest" evaluated constraint. For example, in one embodiment, a BDD may be used to represent both the constraints and the failure condition, and for each constraint, the "size" of that constraint is considered to be the number of nodes in its BDD graph representation, plus the number of nodes in the BDD graph representation of the failure condition that are not common with the nodes in the BDD graph representation of the constraint. The "size" of each evaluated constraint thus determined is used to determine the smallest evaluated constraint. Alternate embodiments may use other representations for the constraints and failure condition other than BDDs and may use other criteria for determining the smallest condition. Alternate embodiments may also choose a constraint from the evaluated constraints whose variables intersect those of the failure condition using other criteria other than the "smallest" or "least complex."

Once C_small is selected, flow proceeds to block 426 where it is applied to the failure condition in hopes of rendering the resulting failure condition false. Therefore, C_small is used to obtain a new failure condition as shown in Equation 6.

$$\text{New\_fail\_cond}=\text{Fail\_cond} \cdot C\_\text{small} \qquad \text{Eq. 6}$$

Then, in block 428, the failure condition is updated with the new failure condition. That is, the failure condition is replaced with the new failure condition, as illustrated in Equation 7.

$$\text{Fail\_cond}=\text{New\_fail\_cond} \qquad \text{Eq. 7}$$

Flow proceeds to decision diamond 430 where it is determined whether the fail condition, Fail_cond, is now false, and if so, the analysis is complete and flow ends with DONE 432. This indicates that the constraint, when applied to the failure condition, resulted in failure condition becoming false. Therefore, by using C_small, the failure was removed. For example, using C1 as C_small (since it is the only constraint (for reference design 200), and thus smallest constraint, in the set of evaluated constraints whose variables intersect those of Fail_cond), and applying it to the Fail_cond of Equation 4, we obtain the following new failure condition (Equation 8).

$$\text{Fail\_cond}=(R'\cdot S+S'\cdot R)\cdot(R\cdot S\cdot D1'\cdot D0'+R'\cdot S'\cdot D1\cdot D0)=0 \qquad \text{Eq. 8}$$

Therefore, the result of applying C1 is that the failure condition was removed, i.e. Fail_cond=0. However, if Fail_cond after block 428 does not result in 0 (i.e. false), flow returns to decision diamond 422 where it is determined whether there are any constraints left in the set of evaluated constraints whose variables intersect any of the variables of the (new) failure condition. If so, flow proceeds through blocks 424, 426, and 428 as described above. So long as the failure condition after the completion of block 428 is not false, a new already evaluated constraint whose variables intersect that of the failure condition is selectively applied until either the failure condition becomes false or there are no more evaluated constraints left whose variables intersect any of the variables of the failure condition. In the latter case, the question in decision diamond 422 results in no, and flow returns to decision diamond 416 where again it is determined whether the set of unevaluated constraints is empty. If not empty, flow proceeds to block 418, where the process described above (starting with selecting another constraint from the set of unevaluated constraints at block 418) repeats. The process continues to repeat until the failure condition becomes false, in which case, flow falls out of flow 400 to DONE 432 via decision diamond 430, 434, or 412, or until the set of unevaluated constraints has become empty leaving no more constraints to apply to the failure condition. If at this point the failure condition is still not made false, flow proceeds from decision diamond 416 to decision diamond 434 to block 436.

Since (upon reaching block 436) the failure condition was not removed with the application of all the constraints available, the design inputs can be optionally modified to take care of the failure condition. The existence of a failure condition indicates either that the reference design and implementation design are not functionally equivalent (i.e. there is a true failure) and the problem has to somehow be fixed or that the failure condition is actually a false failure condition. In the former case, the designs may be modified and re-verified by the user. If the latter case is suspected, a user or a tester can analyze the failure condition and specify additional reference design nodes for stimulation in order to avoid false failures. For example, these additional nodes may result from the fact that the actual circuit design (such as the implementation design) may include a dependency that was not apparent in the reference design. (The addition of these nodes will be discussed further in reference to FIGS. 7 and 8 below.)

Figure 5:
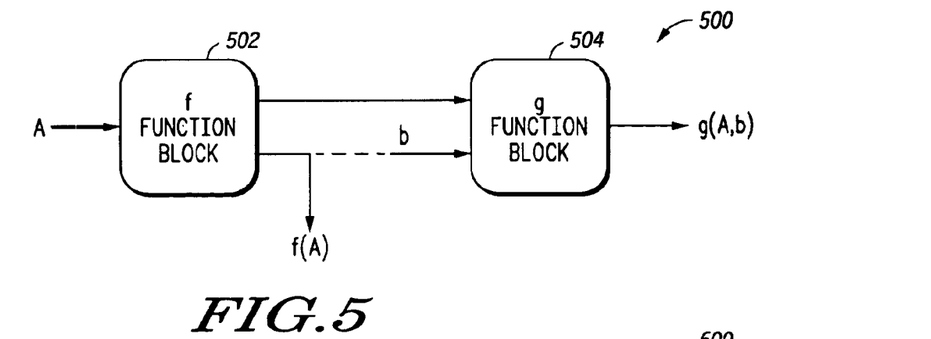
FIGS. 5 and 6 are circuit representations illustrating exemplary designs for a portion of a circuit.
Figure 6:
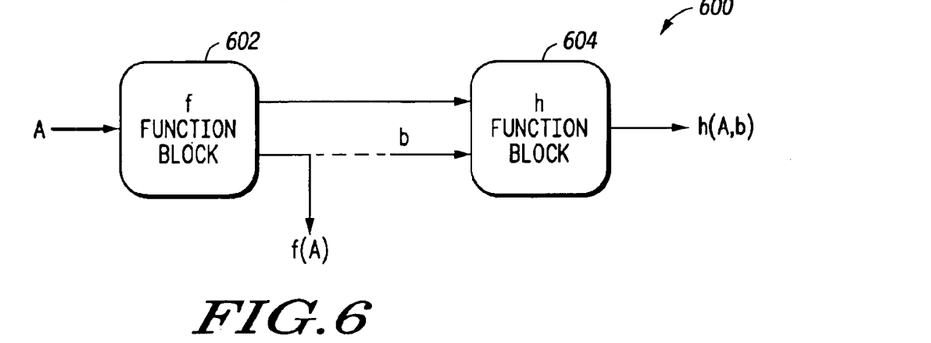

FIGS. 5 and 6 represent more general examples of a reference and implementation design. FIG. 5 illustrates in block diagram form a generic reference design 500 having an f function block 502 coupled to receive an input A and coupled to provide two outputs to g function block 504, which provides an expected output, g(A,b). A cutpoint is introduced in one of the inputs to g function block 504 as indicated by the dotted line in FIG. 5. The cutpoint creates a new output, f(A), and the input to g-function block 504 at the cutpoint is labeled as b. Therefore, the output of g function block 504 is g(A,b) where g is a function of the inputs A and b.

FIG. 6 illustrates in block diagram form a generic implementation design 600 having an f function block 602 coupled to receive an input A and coupled to provide two outputs to h function block 604, which provides an actual output, h(A,b). A cutpoint is introduced in one of the inputs to h function block 604 as indicated by the dotted line in FIG. 6. The cutpoint creates a new output, f(A), and the input to h function block 604 at the cutpoint is labeled as b. Therefore, the output of h function block 604 is h(A,b) where h is a function of the inputs A and b.

Note that in FIG. 5, the variable b has been introduced at the cutpoint. To avoid false negative results, it would be desirable to verify the design only under the constraint b=f(A), where f(A) represents the equation that drives the cutpoint input to g function block 504. Any number of variables (such as b) can be introduced at any number of cutpoints, and is not limited to one. Furthermore, each variable introduced gives rise to such a constraint.

Traditionally, the verification that h(A,b) implements g(A, b) is performed under a set of constraints by forming the conjunctions of all the constraints explicitly. Therefore, traditionally, testers construct the conjunction of the constraints explicitly during the course of verification or require the user to construct the conjunction prior to the commencement of verification. However, unlike the traditional testers, the process illustrated in FIG. 4 avoids the requirement of having to form the conjunctions of the constraints explicitly. In many cases, all the constraints are not necessary for avoiding a false failure, and it may therefore be unnecessary to evaluate or apply all the constraints for each verification. Therefore, as in the embodiment described above in reference to FIGS. 2–4, any constraints may simply be noted, but not evaluated and generated, for any checkpoints. The expected result g(A,b) and the actual result h(A,b) may then be compared without the use of the constraints. This comparison generates a set of failing conditions that may be represented as a Boolean formula. (That is, each comparison may give rise to any number of failure conditions and is not limited to just one.) The constraints that were previously noted whose variables on which they depend intersect those variables of any of the failure conditions within the set of failure conditions may then be selectively evaluated and applied, generally one at time, until either no appropriate constraints remain (indicating a true failure has been detected) or the failure conditions become false (indicating the verification is successful, because the failure was false). Since the constraints are selectively applied, they may not be evaluated until they are to be used. Furthermore, if the failure conditions become false before exhausting the list of unevaluated constraints whose variables intersect those variables of the failure conditions, the remaining unevaluated constraints need not be evaluated at all, thus increasing speed of the tester.

In an alternate embodiment, though, the entire set (or a subset) of the constraints may be evaluated initially, and then later selectively applied (as opposed to evaluating the constraints just prior to applying them). This alternate embodiment also increases speed of the tester since the constraints are only selectively applied, generally one at a time, as needed. This selective application allows for the possibility of applying less than the full set of constraints because once the failure conditions become false, no more constraints need to be applied. Whether the constraints are evaluated initially or only as applied, improved test performance can be achieved through selective application as compared to explicitly conjoining all constraints. Therefore, it can be appreciated how embodiments of the present invention avoid the need of building up explicit conjunction of the constraints prior to commencing verification of a design. Furthermore, the explicit conjunction of constraints may result in conjoining constraints that are not necessary for the verification.

Referring back to FIG. 4, if the failure condition was not removed with the application of all the constraints available, the design inputs can be optionally modified to take care of the failure condition. For example, as described above, the existence of a failure condition (after application of all available constraints) indicates either that the reference design and implementation design are not functionally equivalent (i.e. there is a true failure) and the problem has to somehow be fixed or that the failure condition is actually a false failure condition (possible caused by certain inputs not being properly stimulated). If a false failure is suspected, a user or a tester can analyze the failure condition and specify additional reference design nodes for stimulation. For example, these additional nodes may result from the fact that the actual circuit design (such as the implementation design) may include a dependency that was not apparent in the reference design.

For example, a reference design may be represented in Verilog RTL as follows:

```
module example (a, b, c, d, o);
    input a, b, c, d;
    output o;
    assign o=$f(c,d);
endmodule.
```

In the above example, a module is provided having inputs a, b, c, and d and an output o where o is a function of inputs c and d only (and not a and b). Therefore, the output o depends on c and d to functionally achieve the correct result. (Note that the function "f" can be any function.)

Figure 7:
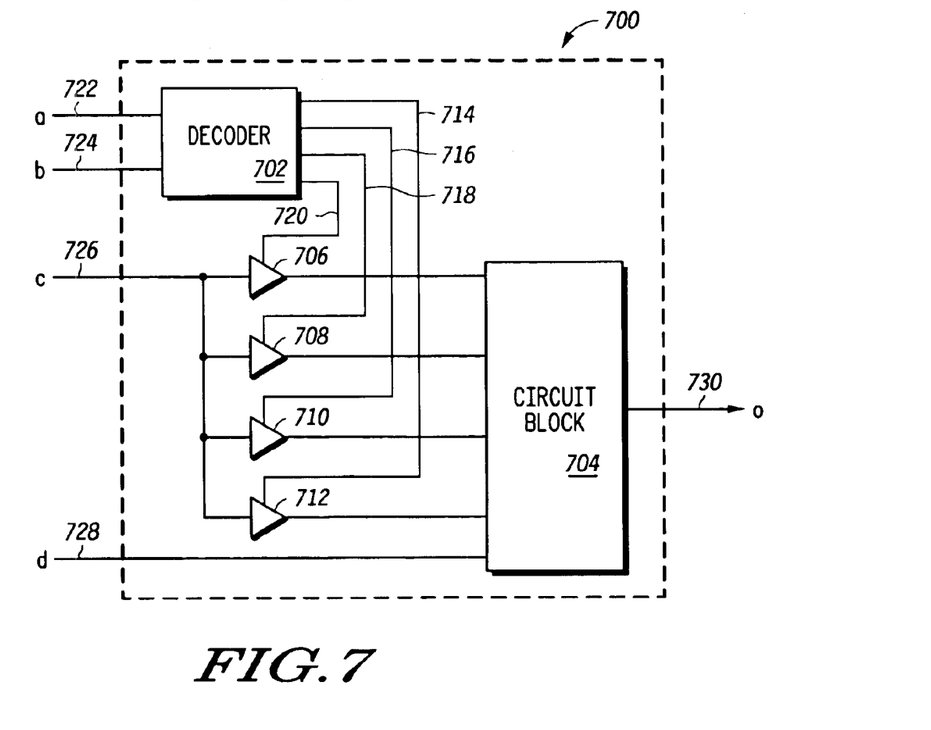
FIG. 7 is a block diagram that illustrates an exemplary design for a portion of a circuit.

However, an implementation design corresponding to the above reference design may include a dependency that is not given in the RTL representation. An example of such a dependency is illustrated in FIG. 7. FIG. 7 illustrates an implementation design 700 that corresponds to the above reference design (RTL module) and includes a decoder 702, tristate buffers 706, 708, 710, and 712, and circuit block 704 which performs some function to produce output o 730 as a function of inputs c 726 and d 728. Therefore, circuit block 704 performs some function "f" (the same function "f" as above in the RTL module) as a function of c, d. Each of tristate buffers 706, 708, 710, and 712 correspond to a different delay path for input c 726. That is, due to the implementation design, c 726 may need to be delayed by different amounts prior to reaching circuit block 704. However, regardless of which path is used (which of the four tristate buffers is enabled) to provide c 726 to circuit block 704, the functionality of circuit block 704 remains unchanged. That is, circuit block 704 provides the same output o 730 and implements function "f" regardless of which delay path is enabled. This is why inputs a 722 and b 724 are not reflected in the assignment portion of the above RTL module (i.e. output o is only a function of c and d in that case). In implementation design 700, though, decoder 702 receives inputs a 722 and b 724, and based on the values of a 722 and b 724, selects one of the four tristate buffers (706, 708, 710, and 712) to enable in order to select a delay path for c 726. Therefore, circuit block 704 needs actual values for inputs a 722 and b 724 in order to be able to properly propagate c 726 to obtain output o 730 for verification.

Since the RTL module does not include the dependency on inputs a and b for obtaining o, a and b are normally set to X or unknown (when using STE). The use of X for inputs a 722 and b 724, though, results in an X for output o 730 after simulating implementation design 700 because a 722 and b 724 were not properly stimulated. Thus, in this example, inputs a 722 and b 724 not being properly stimulated results in a false failure. The X at output o 730 results because the output of each tristate buffer 706, 708, 710, and 712 is X if the enable inputs to the tristate buffers (decoded by decoder 702 and provided to tristate buffers 706, 708, 710, and 712 via paths 720, 718, 716, and 714, respectively) are X. This X is possibly a false failure. The dependency of output o 730 on a 722 and b 724 therefore appears only in the implementation design and not in the reference design. Therefore, this dependency information is used to return to the RTL module and symbolically assign a symbol to both a and b, such as A and B respectively, where each of A and B can take the value of 1 or 0, but not X. Output o 730 can now properly be verified since input c 726 can now be properly propagated to circuit block 704 during the symbolic simulation of implementation design 700.

Taking into consideration inputs a 722 and b 724 results in additional reference design nodes to be used for obtaining assertions, as will be described in reference to FIGS. 4 and 8. Therefore, a user can evaluate an X output (a failure) and determine whether it may be a false failure or not. If the user believes it is, the user may decide to specify additional reference design nodes (such as nodes a 722 and b 724 in the example of FIG. 7) in order to obtain a proper verification. By specifying the additional reference design nodes, these nodes are ensured to receive proper stimulus.

Figure 8:
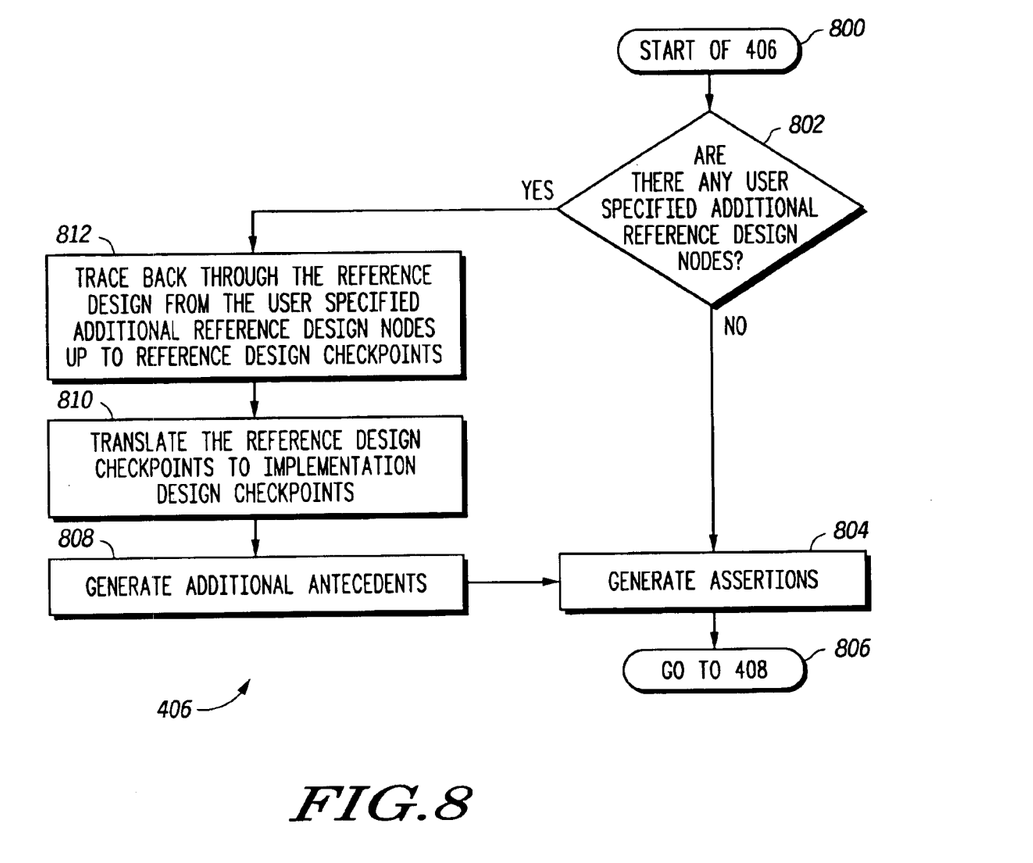
FIG. 8 is a flow diagram that illustrates a method of obtaining assertions according to one embodiment of the present invention.

FIG. 8 illustrates the process of block 406 of FIG. 4. In block 406, assertions corresponding to the reference design are obtained. Flow begins at the start of 406 (block 800) and proceeds to decision diamond 802 where it is determined whether there are any user specified additional reference design nodes. If not, flow proceeds to block 804 where assertions are generated and exits block 406 to go to block 408 at block 806. However, if there are user specified additional reference design nodes, flow proceeds to block 812 where a trace back through the reference design from the user specified additional reference design nodes to reference design checkpoints is performed. The trace back is performed in order to determine how to provide proper stimulus to the additional nodes. For example, referring to FIG. 7, the user may have decided to specify reference design nodes a and b to ensure that o results in a defined value and not X. In the example of FIG. 7, if a and b are primary inputs, then no further trace back through the reference design is needed, since proper stimulus can be provided directly to the primary inputs a and b (and hence, a and b may be referred to as the reference design checkpoints of block 812). However, if a or b are intermediate nodes within the reference design, a trace back from the intermediate node back to a corresponding checkpoint (or checkpoints) is required in order to determine how to stimulate the intermediate node. When an intermediate node cannot be directly stimulated, applying a stimulus to that corresponding checkpoint (or checkpoints) ensures that a proper stimulus will appear at the intermediate node at a desired time.

Flow then proceeds to block 810 where the reference design checkpoints identified in block 812 are translated to implementation design checkpoints. In the example of FIG. 7, the checkpoints a and b in the RTL module (reference design) translate to a 722 and b 724, respectively, in implementation design 700. These implementation checkpoints therefore lead to the generation of additional antecedents in block 808 because they are to be assigned symbolic values rather than Xs. Flow then proceeds to block 804 where assertions are generated and flow continues to block 408 (in block 806).

For the example RTL module above and implementation design 700, the assertions generated without the additional user specified RTL nodes a and b, include the following two antecedents: c is "C" from time t1 to t2; and d is "D" from time t1 to t2 (where each of C and D are able to assume values of 1 or 0 rather than X), and the consequent: o is f(c,d) from time t2 to t3 (i.e. at some point in time after t1 to t2). The consequent represents an expected result. These assertions result in implementation inputs a 722 and b 724 being X, since no antecedent provides stimulation for inputs a 722 and b 724. However, with the additional user specified RTL nodes a and b in this example, the following two antecedents which stimulate inputs a 722 and b 724 are added to the original two: a is "A" from t1 to t2; and b is "B" from t1 to t2 (where each of A and B are able to assume values of 1 or 0 meaning a and b are no longer X). Therefore, with the user specified additional nodes, two additional assertions (for a total of four in this example) and the same expected result are used for the rest of the flow of FIG. 4.

Therefore, it can be appreciated how the use of symbols (such as A and B) rather than X for some inputs can be selectively used in order to reduce the total number of symbols since the overuse of symbols in a symbolic simulation can become prohibitively complex. In the example of FIG. 7, X's were conservatively used for inputs a and b since their dependency was not reflected in the corresponding RTL module. However, the user is allowed to specify these nodes to be symbols rather than unknowns in order to help avoid false failures. The user can name any signal in the design and a relative time and the tester can then stimulate the checkpoints (such as a 722 and b 724 in the example of FIG. 7) that drive the named signal so as to assure that the named signal will have a well defined value (1 or 0) at the time specified.

While the above embodiment was described in reference to user specified additional reference design nodes, alternate embodiments may allow for a tester to automatically generate additional reference design nodes. Also, alternate embodiments may allow the tester or a user to specify additional reference design nodes in a different manner than by simply naming a signal and a relative time.

Using the above illustrative methods, a circuit design, represented by design views 100, may be formally verified thereby providing increased confidence that the design will operate according to its specifications. Since reference design 102 can be simulated on a computer significantly faster than implementation design 104, and since implementation design 104 may be demonstrated to be functionally equivalent to a predetermined functionality of reference design 102, a circuit design block may be tested and debugged more quickly, leading to faster time to market for semiconductor devices manufactured in reliance upon the verified design block. Furthermore, the above illustrative methods allow for the selective application of constraints implicitly rather than the explicit application of all constraints prior to comparing the expected and actual results. The above illustrative methods also allow for the selective use of symbols rather than X's in order to avoid false failures due to certain inputs not being properly stimulated.

Also, alternate embodiments may use other types of testers which may use the method of post selective application of constraints rather than upfront explicit conjunction of constraints. That is, although embodiments of the present invention have been described in reference to an STE verification system, other testers, such as, for example, other types of verification and equivalence systems, combinational Boolean equivalence checkers, model checkers, etc. may be used instead.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, where symbolic functions such as Boolean functions have been used, functions over any finite domain, such as ternary or quaternary functions could be used. These functions could have various representations, of which BDDs are one example. Symbolic assertions may also have various representations, such as, for example, the circuit node name, guard, value and time interval as disclosed or may include other representations. For example, while the first design block view 102 and the second design block view 104 were described with reference to the same design block 100, the method and technique are not limited to comparing different views of the same design. Rather, the illustrative method may be used to compare any data files having design representations. Therefore, it is intended that this invention encompass all of the variations and modifications as fall within the scope of the appended claims and equivalents thereof.

What is claimed is:

1. A verification system comprising:
   a representation of a first design representing a specification having a predetermined functionality;
   a representation of a second design, the representation of the second design intended to satisfy the predetermined functionality of the first design, the verification system functioning to affirm that the representation of the second design satisfies the predetermined functionality of the representation of the first design;
   a plurality of design inputs;
   a tester for comparing the representation of the second design with the representation of the first design, and detecting when the representation of the second design does not satisfy the representation of the first design, the tester providing a failure indicator and a characterization of a failure in response to the detecting, the tester further comprising:
      a failure analyzer for applying one or more constraints to the characterization of the failure, the one or more constraints representing restrictions on permissible test parameters of the second design representation, and determining whether the one or more constraints will prevent the failure from occurring.

2. The verification system of claim 1 wherein the verification system functions to affirm that the second design is fully functionally equivalent to the first design.

3. The verification system of claim 1 wherein one of the first design or the second design is an RTL representation and the other is a gate level representation.

4. The verification system of claim 1 wherein one of the first design or the second design is an RTL representation and the other is a transistor level representation.

5. The verification system of claim 1 wherein the representation of the first design and the representation of the second design are two different representations of a same design.

6. The verification system of claim 1 wherein the constraints are supplied as design inputs.

7. The verification system of claim 1 wherein the constraints are supplied by a user of the verification system.

8. The verification system of claim 1 wherein the constraints originate from the tester.

9. The verification system of claim 1 wherein the first design and the second design represent a portion of an integrated circuit design that is less than all of the integrated circuit design, and wherein another portion of the integrated circuit design at least partially determines the one or more constraints.

10. The verification system of claim 1 wherein the one or more constraints further comprise a set of constraints, and an order in which the set of constraints is applied is dependent upon the characterization of the failure.

11. The verification system of claim 10 wherein not every constraint within the set of constraints is applied to the characterization of the failure.

12. The verification system of claim 1 wherein the one or more constraints are generated by any of the following comprising:
(a) creation of cutpoints in the representation of the first design and the representation of the second design;
(b) input signals external to the representation of the first design and the representation of the second design; or
(c) state-holding elements contained within the representation of the first design and the representation of the second design.

13. A method of verifying functional similarity between a first design and a second design intended to satisfy functionality of the first design, comprising:
receiving a representation of the first design;
receiving a representation of the second design;
receiving a plurality of design inputs;
executing a test program on a computer that compares the representation of the second design with the representation of the first design, and detecting when the representation of the second design does not satisfy the representation of the first design, the test program providing a failure indicator and a characterization of a failure in response to the detecting, the test program further comprising:
applying one or more constraints to the characterization of the failure, the one or more constraints representing restrictions on permissible test parameters of the second design representation, and analyzing the failure by determining whether the one or more constraints will prevent the failure from occurring.

14. The method of claim 13 further comprising:
affirming that the second design is fully functionally equivalent to the first design.

15. The method of claim 13 further comprising:
obtaining the one or more constraints that are applied to the characterization of the failure as a portion of the plurality of design inputs that are received.

16. The method of claim 13 further comprising:
permitting another design separate from the first design and the second design to at least partially determine, the one or more constraints.

17. The method of claim 13 further comprising:
creating a set of constraints, and applying predetermined ones of the set of constraints in an order that is dependent upon the characterization of the failure.

18. The method of claim 13 further comprising:
generating the one or more constraints by having constraints associated with any of the following comprising:
cutpoints created in the representation of the first design and the representation of the second design, input signals external to the representation of the first design and the representation of the second design, or state holding elements contained within the representation of the first design and the representation of the second design.

19. A computer readable storage medium for storing a verification system, comprising:
a set of instructions, the set of instructions when executed implementing a verification process comprising:
receiving a representation of a first design representing a specification having a predetermined functionality;
receiving a representation of a second design, the representation of the second design intended to satisfy the predetermined functionality of the first design, the verification system functioning to affirm that the representation of the second design does in fact satisfy the predetermined functionality of the representation of the first design;
receiving a plurality of design inputs;
comparing the representation of the second design with the representation of the first design, and detecting when the representation of the second design does not satisfy the representation of the first design, the detecting resulting in providing a failure indicator and a characterization of a failure; and
applying one or more constraints to the characterization of the failure, the one or more constraints representing restrictions on permissible test parameters of the second design representation, and determining whether the one or more constraints will prevent the failure from occurring.

20. The computer readable storage medium of claim 19 further comprising:
maintaining the one or more constraints in a list that is applied in an order based upon the characterization of the failure in response to the set of instructions.

21. A verification system, comprising:
a representation of a first design representing a specification having a predetermined functionality;
a representation of a second design, the representation of the second design intended to satisfy the predetermined functionality of the first design, the verification system functioning to affirm that the representation of the second design does in fact satisfy the predetermined functionality of the representation of the first design;
a plurality of design inputs;
a tester for comparing the representation of the second design with the representation of the first design, and detecting when the representation of the second design does not satisfy the representation of the first design, the tester providing a failure indicator and a characterization of a failure in response to the detecting, the tester further comprising:
a symbolic stimulus generator that analyzes the representation of the first design to determine a set of inputs to a test point and generates a set of symbolic stimulus to be applied to corresponding test point inputs in the representation of the second design, the tester accepting as an additional input one or more additional nodes in the first design, finding additional inputs corresponding to the additional nodes, generating a second set of symbolic stimulus from the additional inputs, applying the second set of symbolic stimulus to corresponding inputs in the representation of the second design, and generating an output response for use in verifying functional similarity.

22. The verification system of claim 21 wherein the finding of additional inputs corresponding to the additional nodes comprises tracing from an output-to-input direction through the representation of the first design to identify the additional inputs.

23. The verification system of claim 21 wherein the corresponding inputs in the representation of the second design do not structurally exist in identical form in the representation of the first design, but correspondence in functional result exists.

24. A method of verifying functional similarity between a first design and a second design intended to satisfy functionality of the first design, comprising:

receiving a representation of the first design;
receiving a representation of the second design;
receiving a plurality of design inputs;
comparing the representation of the second design with the representation of the first design, detecting when the representation of the second design does not satisfy the representation of the first design, and providing a failure indicator and a characterization of a failure in response to the detecting;
analyzing with a symbolic stimulus generator the representation of the first design to determine a set of inputs to a test point;
generating a set of symbolic stimulus to be applied to corresponding test point inputs in the representation of the second design;
accepting as an additional input one or more additional nodes in the first design;
finding additional inputs in the first design corresponding to the additional nodes;
generating a second set of symbolic stimulus from the additional inputs; and
applying the second set of symbolic stimulus to corresponding inputs in the representation of the second design and generating an output response for use in verifying functional similarity.

25. The method of claim 24 wherein the finding additional inputs in the first design corresponding to the additional nodes further comprises tracing from an output-to-input direction through the representation of the first design to identify the additional inputs.

26. A computer readable storage medium for storing a verification system, comprising:

a set of instructions, the set of instructions when executed implementing a verification process comprising:
receiving a representation of the first design;
receiving a representation of the second design;
receiving a plurality of design inputs;
comparing the representation of the second design with the representation of the first design, detecting when the representation of the second design does not satisfy the representation of the first design, and providing a failure indicator and a characterization of a failure in response to the detecting;
analyzing with a symbolic stimulus generator the representation of the first design to determine a set of inputs to a test point;
generating a set of symbolic stimulus to be applied to corresponding test point inputs in the representation of the second design;
accepting as an additional input one or more additional nodes in the first design;
finding additional inputs in the first design corresponding to the additional nodes;
generating a second set of symbolic stimulus from the additional inputs; and
applying the second set of symbolic stimulus to corresponding inputs in the representation of the second design and generating an output response for use in verifying functional similarity.

* * * * *